United States Patent [19]
Fischman et al.

[11] 3,979,640
[45] Sept. 7, 1976

[54] HORIZONTAL DEFLECTION SYSTEM

[75] Inventors: Martin Fischman, Seneca Falls; Jesse H. L'Hommedieu, Waterloo, both of N.Y.

[73] Assignee: GTE Sylvania Incorporated, Stamford, Conn.

[22] Filed: July 30, 1975

[21] Appl. No.: 600,403

[52] U.S. Cl. ............................. 315/387; 315/408
[51] Int. Cl.² ................. H01J 29/70; H01J 29/72
[58] Field of Search ........... 315/399, 407, 408, 387

[56] References Cited
UNITED STATES PATENTS 3,774,069  11/1973  Yasumatsuya ..................... 315/408

OTHER PUBLICATIONS

Wessel, "A New Hor. Out. Defl. Ckt.," IEEE Transactions on Broadcast & TV Receivers, vol. BTR-18, Aug. 72, pp. 177–182.
Maytum, "Transistorised Self-stabilizing Hor. Defl. Systems," IEEE Transact. on Broadcast & TV Receivers, vol. BTR-20, Feb. 74, pp. 32–64.
"RCA Transistors Serve All Power Functions in Solid State TV Set Employing 19V,119° Color Picture Tube with Precision Static Toroid Yoke," Issued by RCA Corp., 6-16-74, pp. 1–6.

*Primary Examiner*—Maynard R. Wilbur
*Assistant Examiner*—T. M. Blum
*Attorney, Agent, or Firm*—Norman J. O'Malley; Robert E. Walrath; Robert E. Orner

[57] ABSTRACT

A self-regulating horizontal deflection system with feedback indicative of the magnitude of an unregulated voltage source and of load variations to pulse width modulate the output of the horizontal oscillator is shown. Separate turn-on and turn-off drivers are transformer coupled by separate primary windings to the horizontal output transistor to optimize the driver stage and conserve power.

10 Claims, 6 Drawing Figures

HORIZONTAL DEFLECTION SYSTEM

CROSS-REFERENCE TO RELATED APPLICATIONS

M. Fischamn et al., "Horizontal Deflection System," (Ser. No. 600,405), and M. Fischman et al., "Horizontal Deflection System," (Ser. No. 600,404), filed concurrently herewith and assigned to the same assignee as the present invention.

FIELD OF THE INVENTION

This invention relates to horizontal deflection systems and more particularly to transformer coupled self-regulating horizontal deflection systems.

BACKGROUND OF THE INVENTION

Typical prior art deflection systems in common use in television receivers include a fixed duty cycle horizontal oscillator coupled by a driver transistor and driver transformer to a horizontal output transistor. The horizontal output transistor is connected to a horizontal deflection winding contained in a yoke associated with a cathode ray tube. The objective of this circuitry is to deflect the electron beam or beams in the cathode ray tube in the horizontal direction at a relatively high rate such as 15,734 lines per second as is used in the NTSC system.

The design of the driver and horizontal output transistor stages is very critical. In typical circuits the horizontal output transistor conducts during the last half of the trace interval and is sharply cut-off to initiate retrace. During retrace a large retrace or flyback voltage appears at the collector of the horizontal output transistor. If the transistor is conducting when this voltage appears, the retrace current will be altered and the transistor will dissipate excessive power which generally will result in damage to the transistor. Since the horizontal output transistor is conducting heavily immediately before retrace is initiated, the stored charge in the base and collector regions of the transistor must be removed before the transistor will cease conducting collector current. Normally this stored charge is removed by applying a negative pulse to the base of an NPN transistor to cause a reverse base current to flow. This negative pulse, however, should be applied only as long as necessary to alleviate the voltage stress on the collector-base junction during retrace. R. J. Walker and R. Yu, "Horizontal Output Transistor Base Circuit Design," IEEE Transactions on Broadcast and Television Receivers, Vol. BTR-20, Aug. 1974, pp. 185–192, describe the various design requirements for the base circuit of the horizontal output transistor.

The above design requirements place severe limitations on the horizontal driver transistor and transformer design. In typical circuits conduction by the driver transistor during retrace and the first half of trace switches the output transistor off. The driver transformer stores energy during conduction by the driver transistor which is used to provide forward base current to the horizontal output transistor during the following conduction interval of the output transistor. Accordingly, the drive current in the primary winding must be of the proper amplitude and duration to maintain the horizontal output transistor in conduction in saturation during the second half of trace. When the driver transistor turns on again, the initial current flow through the primary winding of the driver transformer provides a turn-off pulse to the base of the output transistor. The amplitude and duration of the turn-off pulse are dependent on the inductances and the turns ratio of the driver transformer windings.

The critical design requirements of the driver and output stages also necessitates a well-regulated voltage supply for both the driver circuitry and the output circuitry. Accordingly, typical prior art horizontal deflection systems are energized by a voltage supply derived from rectification of the line voltage, but regulated so that the voltage levels vary within narrow limits. Typical prior art voltage regulators used for this purpose include series regulators and constant voltage power transformers as well as other similar circuitry.

One form of known voltage regulator is a switching regulator which regulates by varying the conduction time of a switch with the amplitude of the unregulated voltage. In horizontal deflection systems the horizontal output transistor is operated as a switch. Since the horizontal output transistor does not conduct during the entire trace interval, the portion that it does not conduct deflection current can be used for regulation. P. L. Wessel, "A New Horizontal Output Deflection Circuit," IEEE Transactions On Broadcast and Television Receivers, Vol. BTR-18, Aug. 1972, pp. 177–182, and M. J. Maytum, "Transistorized Self-Stabilizing Horizontal-Deflection Systems," IEEE Transactions On Broadcast and Television Receivers, Vol. BTR-20, Feb. 1974, pp. 32–64, describe various self-regulating horizontal deflection circuits. In such circuits the horizontal output transistor is isolated from the deflection winding during that portion of trace when the damper or trace diode is conducting. During this time, the output of the horizontal oscillator is pulse width modulated so that the conduction time of the horizontal output transistor varies over relatively broad limits sufficient to provide regulation of an unregulated voltage supply and regulation against load variations.

Self-regulating horizontal deflection systems, however, place even more severe requirements on the horizontal driver circuitry since the conduction and non-conduction intervals vary. When a low unregulated voltage requires a long conduction interval by the horizontal output transistor, the driver conducts for a shorter interval, yet must permit sufficient energy to be stored in the driver transformer to cause the output transistor to conduct in saturation for a longer interval. When the unregulated voltage is high, however, the driver conducts for a longer interval and causes excess energy to be stored in the driver transformer thereby providing excess base drive to the horizontal output transistor. Excess base drive, in turn, causes excess charge storage in the base and collector regions of the output transistor thereby varying the turn-off drive requirements. While some improvements in prior art drivers can be obtained by using current sources, the conflicting requirements of the turn-on and turn-off drives generally require deleterious compromises to be made. Furthermore, the base drive of the output transistor is generally excessive during most operating conditions thereby causing excessive power dissipation and heat generation.

OBJECTS OF THE INVENTION

Accordingly, it is a primary object of this invention to provide a self-regulating horizontal deflection system which overcomes the above-noted and other disadvantages of the prior art.

It is a further object of this invention to provide a self-regulating horizontal deflection system with decreased power consumption.

It is still a further object of this invention to provide a self-regulating horizontal deflection system in which the forward and reverse drive signals can be optimized.

It is still a further object of this invention to provide a self-regulating horizontal deflection system in which excess driver current is not required to obtain sufficient drive for the horizontal output transistor.

It is a yet further object of this invention to provide a self-regulating horizontal deflection system including a driver transformer wherein the primary and secondary winding inductances can be optimized for optimized base drive to the horizontal output transistor.

SUMMARY OF THE INVENTION

In one aspect of this invention the above and other objects and advantages are achieved in a self-regulating horizontal deflection system for a television receiver which includes a signal receiver, a video channel connected thereto, and a cathode ray tube connected to the video channel. The selfregulating horizontal deflection system includes a horizontal deflection winding associated with the cathode ray tube, a horizontal output stage, feedback means, and pulse width modulating means. The horizontal output stage is connected to a source of unregulated voltage and to the horizontal deflection winding for providing a deflection signal thereto. The feedback means is connected to or in circuit with the horizontal output stage for providing a feedback signal indicative of the magnitude of the unregulated voltage to the pulse width modulating means. The pulse width modulating means is connected to the video channel and provides a pulse signal synchronized with a composite video signal from the video channel and modulated in accordance with the signal from the feedback means. A driver transistor and transformer are connected between the pulse width modulating means and the horizontal output stage. The transformer has an output winding connected to the horizontal output stage and first and second input windings. The driver transistor is connected to the pulse width modulating means and to the first input winding for applying the pulses from the pulse width modulating means to the first input winding with an amplitude and shape sufficient to drive the horizontal output stage to provide the deflection signal to the horizontal output winding. The width modulation of the pulses compensates for variations of the unregulated voltage and/or or load variations. A semiconductor switch is connected to the pulse width modulating means and to to the second input winding of the transformer for initiating retrace of the electron beam deflection in the cathode ray tube by switching the horizontal output stage.

DETAILED DESCRIPTION OF THE PREFERRED EMBODIMENTS

For a better understanding of the present invention, together with other and further objects, advantages and capabilities thereof, reference is made to the following disclosure in conjunction with the accompanying drawings.

Figure 1:
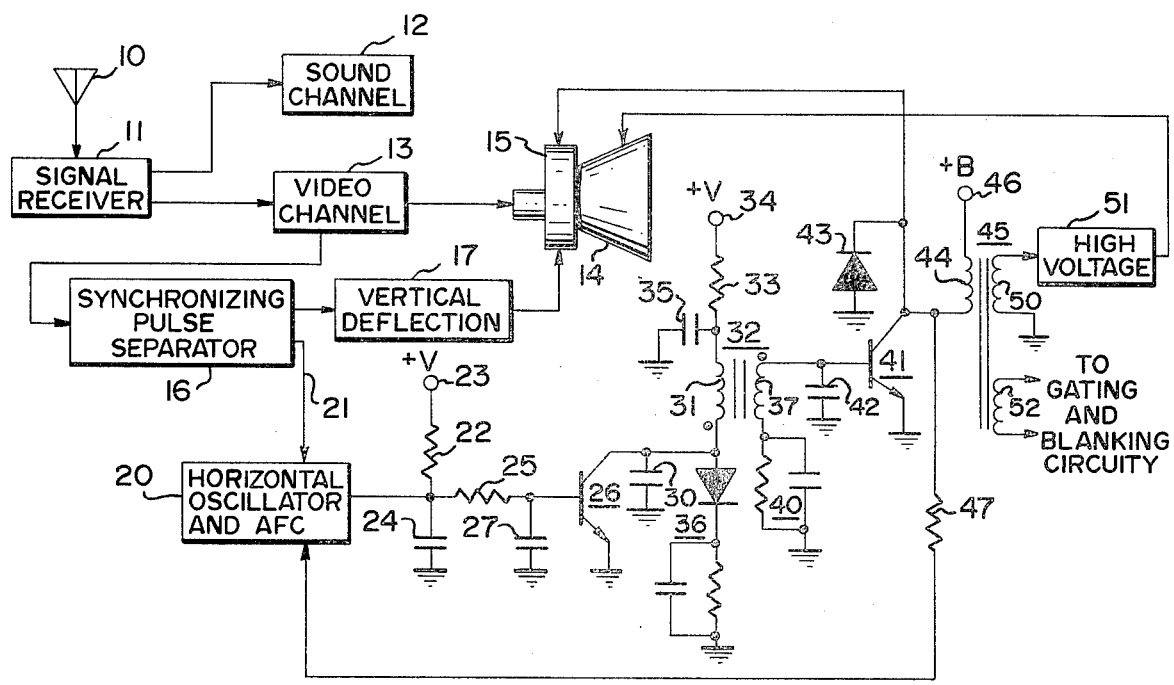
FIG. 1 is a block and schematic diagram of a prior art horizontal deflection system incorporated in a television receiver.

FIG. 1 illustrates a prior art horizontal deflection system of a type currently used in television receivers. As such, FIG. 1 is exemplary of the prior art, however, those skilled in the art will realize that various other forms of horizontal deflection circuity are well known and have been widely used in the prior art.

In FIG. 1 an antenna 10 or equivalent signal receiving means provides an RF modulated composite video signal to a signal receiver 11 which includes the usual radio frequency, intermediate frequency, and automatic gain control circuity as well as other typical associated circuitry. Signal receiver 11 provides the sound portion of the received signal to a sound channel 12 and the video portion to a video chanel 13. Video channel 13, which can include typical luminance and chrominance circuitry, provides one or more signals to a cathode ray tube (CRT) 14 to modulate the electron beam or beams therein in accordance with the received signal. CRT 14 has associated therewith a deflection yoke 15 which includes vertical and horizontal deflection windings. Yoke 15 can be of any suitable type such as that commonly called a saddle yoke or a toroidal yoke or the like.

Video channel 13 provides a composite video signal to synchronizing pulse separator 16 which provides separated vertical synchronizing pulses to vertical deflection circuit 17. Vertical deflection circuit 17 provides a vertical deflection signal to the vertical deflection windings of yoke 15. Synchronizing pulse separator 16 also provides separated horizontal synchronizing pulses to horizontal oscillator and automatic frequency control (AFC) 20 via a lead 21.

An output of oscillator 20 is connected by a resistor 22 to a source of supply voltage illustrated as a terminal 23, by a capacitor 24 to circuit ground, and by a resistor 25 to a base of a driver transistor 26. The base of driver transistor 26 is further connected by a capacitor 27 to circuit ground. An emitter of transistor 26 is connected to circuit ground and a collector is connected by a capacitor 30 to circuit ground and via a primary winding 31 of a driver transformer 32 and a series connected resistor 33 to a source of supply voltage illustrated as a terminal 34. The junction of resistor 33 and primary winding 31 is connected by a capacitor 35 to circuit ground. The collector of transistor 26 is connected by a wave shaping circuit 36 to circuit ground.

Transformer 32 has a secondary winding 37 with one end connected to circuit ground by a parallel RC circuit 40 and the other end connected to a base of a horizontal output transistor 41. The base of transistor 41 is further connected to circuit ground by a capacitor 42. An emitter of transistor 41 is connected to circuit ground and a collector is connected to the horizontal deflection winding in yoke 15. A damper diode 43 is connected from circuit ground to the collector of transistor 41 which is further connected by a primary winding 44 of a horizontal output transformer 45 to a source of supply voltage illustrated as a terminal 46. The collector of transistor 41 is further connected by a resistor 47 to AFC circuit 20. A secondary winding 50 of transformer 45 is connected between circuit ground and a high voltage circuit 51 which provides the second anode voltage for CRT 14 and can provide other high operating voltages for CRT 14. A secondary winding 52 of transformer 45 provides various gating and blanking pulses to circuitry such as the AGC circuitry in signal receiver 11, the blanking and burst gating circuitry in video channel 13, convergence circuitry, and the like.

In operation, the AFC circuit in block 20 synchronizes the horizontal oscillator with the separated horizontal synchronizing pulses on lead 21. Pulses having a duty cycle of approximately 50% are coupled to the base of transistor 26 which operates in a switching mode. When transistor 26 is conducting, current flow through primary winding 31 of transformer 32 causes energy to be stored in the field associated with the primary winding. When transistor 26 is turned off, the energy stored in primary winding 31 is transferred to secondary winding 37 to turn transistor 41 on. Transistor 41 conducts in saturation until the end of the scanning interval. At the end of the scanning interval transistor 26 is turned on and the current in primary winding 31 will increase abruptly and then decrease until all of the charge is removed from the base of output transistor 41. This initial pulse of current through primary winding 31 is illustrated by pulse 53 of waveform 54 of FIG. 2 which illustrates the current through primary winding 31. After the initial current pulse 53, the current through primary winding 31 will rise exponentially at a rate determined by the magnitude of source 34, the inductance of winding 31, and the series resistance to store energy in the fields associated with winding 31.

Figure 2:
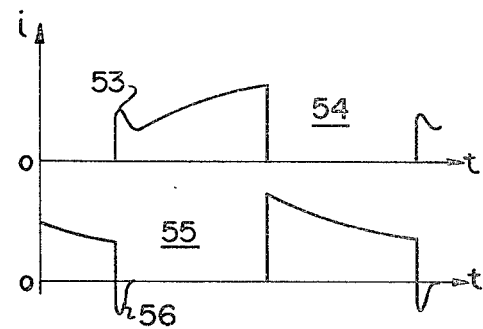
FIG. 2 is a waveform diagram to aid in explaining the operation of the horizontal deflection system of FIG. 1.

Waveform 55 of FIG. 2 illustrates the base current of transistor 41. Initially, at turn off, a reverse current pulse 56 flows out of the base of transistor 41 to turn transistor 41 off. When transistor 26 turns on again, the energy stored in primary winding 31 is transferred to secondary winding 37 which results in an initial base current in transistor 41 equal to the peak current in primary winding 31 times the inverse of the turns ratio of the windings. At this point in the operating cycle the base current of transistor 41 is greatly in excess of that necessary for conduction in saturation by transistor 41. Accordingly, excess power is being dissipated in the base circuit of transistor 41. After the initial turn on of transistor 41, the base current will decay exponentially at a rate determined by the inductance of winding 37 and the resistance in series therewith. Just prior to the time transistor 41 is turned off, its collector current is at a maximum and the base current must be sufficient to maintain transistor 41 in saturation.

Accordingly, a number of factors indicated above, as well as other factors, dictate the various circuit constants. For a given supply voltage and base current requirement of transistor 41, the primary and secondary inductances and the turns ratio of transformer 32 are substantially dictated. Sources 34 and 46 generally must be well-regulated voltage sources for proper operation. In typical prior art circuits of the type illustrated, series voltage regulators and constant voltage transformers have been used to provide satisfactory regulation, however, at a substantial expense both in components and power dissipation. In order to avoid this expense and power loss, self-regulating horizontal deflection systems utilize the horizontal output transistor as a switching regulator by pulse width modulating the off time.

It is readily seen, however, that pulse width modulating the output of horizontal oscillator 20 imposes even more severe requirements on transistor 26 and transformer 32 together with their associated circuitry. For example, since the conduction time of transistor 26 is modulated, sufficient current must flow through primary winding 31 to store sufficient energy to maintain the base drive to transistor 41 during a longer conduction interval. In fact, if the illustrated arrangement is used in a self-regulating system the conduction time of the driver transistor decreases as conduction time of the output transistor increases and vice versa. Since the driver transistor and transformer must be designed for all conditions of drive signals, substantial excess drive power will be wasted, particularly during conditions where the driver transistor is conducting for its longest interval.

Figure 3:
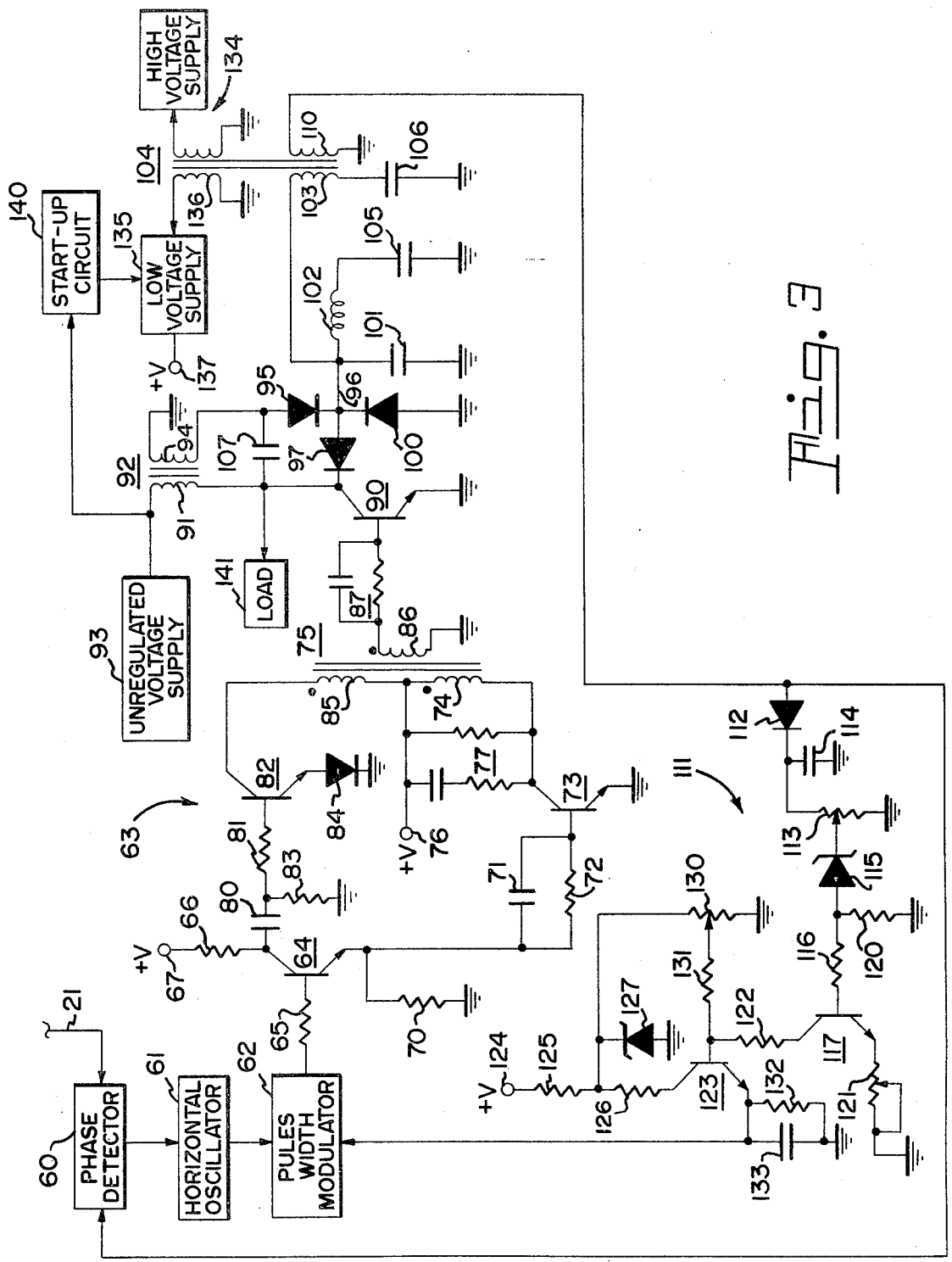
FIG. 3 is a block and schematic diagram of a preferred embodiment of the invention.

FIG. 3 is a block and schematic diagram of a self-regulating horizontal deflection system incorporating driver circuitry in accordance with the invention. The portions of the television receiver not illustrated in FIG. 3 can be the same as those illustrated in FIG. 1. Separated horizontal synchronizing pulses are coupled via lead 21 to a phase detector 60 which provides a frequency and phase correction signal to a horizontal oscillator 61 in the usual manner. The output pulses from horizontal oscillator 61 are coupled to a pulse width modulator 62. In general, phase detector 60, horizontal oscillator 61, and pulse width modulator 62 comprise a pulse width modulating means connected to the video channel.

The pulses from modulator 62 are connected to a driver means 63. The driver means 63 includes a transistor 64 having a base connected via a resistor 65 to the output of modulator 62, a collector connected via a resistor 66 to a source of supply voltage illustrated as a terminal 67, and an emitter connected via a resistor 70 to circuit ground. The emitter of transistor 64 is further connected by a capacitor 71 and resistor 72 connected in parallel to a base of a driver transistor 73. Driver transistor 73 has an emitter connected to circuit ground and a collector connected to one end of a first input winding 74 of a transformer 75 the other end of which is connected to a source of supply voltage illustrated as a terminal 76. A damping circuit 77 is connected in parallel with input winding 74.

The collector of transistor 64 is further connected by a capacitor 80 in series with a resistor 81 to an input of a semiconductor switch illustrated as a base of a transistor 82. The junction of capacitor 80 and resistor 81 is connected by a resistor 83 to circuit ground. An emitter of transistor 82 is connected by a diode 84 to circuit ground to protect transistor 82 from reverse current. An output electrode illustrated as a collector of transistor 82 is connected to one end of a second input winding 85 of transformer 75 the other end of which is connected to source 76.

Transformer 75 further has an output winding 86 connected to a horizontal output stage. One end of winding 86 is connected to circuit ground and the other end is connected via a parallel RC circuit 87 to an input electrode illustrated as a base of a transistor 90 which has a common electrode illustrated as an emitter connected to circuit ground. An output electrode illustrated as a collector of transistor 90 is connected by a primary winding 91 of a supply transformer 92 to a source of unregulated supply voltage 93. A secondary winding 94 of transformer 92 has one end connected to circuit ground and the other end connected via a diode 95 to a junction 96. Junction 96 is further connected by a diode 97 to the collector of transistor 90, by a reverse-poled diode 100 to circuit ground, by a capacitor 101 to circuit ground, to one end of a horizontal deflection winding 102, and to one end of a primary winding 103 of a horizontal output transformer 104. The other end of horizontal deflection winding 102 is connected by a coupling capacitor 105 to circuit ground, while the other end of primary winding 103 of transformer 104 is connected by a coupling capacitor 106 to circuit ground. A capacitor 107 for suppressing parasitic oscillations is connected between the collector of transistor 90 and the junction of winding 94 with diode 95.

A secondary winding 110 of transformer 104 has one end connected to circuit ground and the other end connected to a voltage comparator 111 and to an input of phase detector 60. Transformer 104 and voltage comparator 111 comprise a feedback means connected to the horizontal output stage for providing a signal indicative of the magnitude of the unregulated voltage provided by source 93. Voltage comparator 111 includes a diode 112 connected from winding 110 to one end of the resistance element of a potentiometer 113, the other end of which is connected to circuit ground. A capacitor 114 is connected in parallel with the resistance element of potentiometer 113. A variable tap of potentiometer 113 is connected via a Zener diode 115 in series with a resistor 116 to a base of a transistor 117. The junction of Zener diode 115 with resistor 116 is connected by a resistor 120 to circuit ground. An emitter of transistor 117 is connected by a variable resistor 121 to circuit ground. A collector of transistor 117 is connected by a resistor 122 to a base of a transistor 123. A source of supply voltage illustrated as a terminal 124 is connected by a resistor 125 in series with resistor 126 to a collector of transistor 123. The junction of resistors 125 and 126 is connected to circuit ground by a Zener diode 127 in parallel with a resistance element of a potentiometer 130. A tap of potentiometer 130 is connected by a resistor 131 to the base of transistor 123. An emitter of transistor 123 is connected by a resistor 132 in parallel with a capacitor 133 to circuit ground and to an error voltage input of pulse width modulator 62.

In a self-regulating horizontal deflection system, regulation is provided in the deflection system itself so that other operating voltages for the television receiver are preferably derived from the horizontal output stage. For example, the usual high voltage supply 134 can be derived from rectification of flyback pulses in horizontal output transformer 104. Similarly, a low voltage supply 135 is derived from rectification of pulses provided by a secondary winding 136 on transformer 104 to provide a regulated voltage at a terminal 137 which can be connected to the various voltage sources illustrated as terminals 67, 76, and 124. It should be noted that the self-regulating horizontal deflection system also regulates against load variations as well as supply voltage variations.

Since low voltage supply 135 provides voltage to the driver circuitry which must start operating before the output stage begins operating, a start-up circuit 140 is connected from the unregulated voltage supply 93 to low voltage supply 135 to provide a start-up voltage. Start-up circuit 140 can be, for example, any circuit which initially provides sufficient voltage to cause the driver circuitry to begin operating. Once the driver circuitry begins operating, the horizontal output stage provides voltage to the driver circuitry as will be explained hereinafter. A load 141 is illustrated as being connected to the collector of transistor 90. Load 141 can be, for example, the screen grids of a cathode ray tube which are energized by the collector voltage of transistor 90 in the usual manner.

In operation, phase detector 60 receives synchronizing pulses from the synchonizing pulse separator via lead 21 and flyback pulses from secondary winding 110 of transformer 104 and provides a control voltage to horizontal oscillator 61 to control the phase and/or frequency thereof. Horizontal oscillator 61 provides pulses at the horizontal deflection rate which are pulse width modulated by modulator 62 in accordance with an error voltage from voltage comparator 111. Phase detector 60, horizontal oscillator 61, and pulse width modulator 62, can be any suitable circuitry. In practice, a TV horizontal processor integrated circuit, No. MC1391P, manufactured by Motorola Semiconductor Products Inc. has been used. The pulses applied to phase detector 60 are illustrated as being derived from secondary winding 110, however, in various prior art arrangements the feedback pulses have been derived from the primary winding of the horizontal output transformer and from the collector of the horizontal output transistor as well. Those skilled in the art will realize that one of the various prior art alternatives could be used as well.

The width modulated pulses from modulator 62 are coupled to the base of transistor 64. When transistor 64 is switched on, transistor 73 is also switched on to provide a current path through input winding 74 of transformer 75. Current flow through input winding 74 causes a voltage to be developed across output winding 86 which switches transistor 90 on. Similarly, when transistor 64 is switched off, a positive-going pulse is coupled by capacitor 80 and resistor 81 to the base of transistor 82 to switch transistor 82 on and complete a current path through input winding 85 of transformer 75. Current flow through input winding 85 causes a negative voltage to be developed at the base of transistor 90 to switch transistor 90 off and initiate retrace of the electron beam scanning in the cathode ray tube.

Figure 4A:
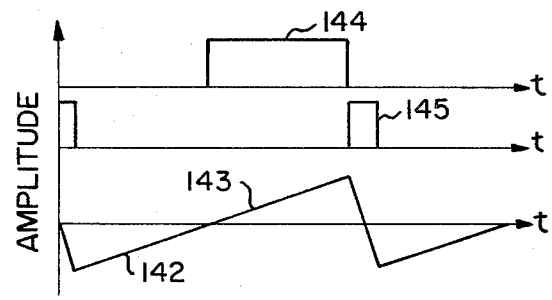
FIGS. 4A and 4B are waveform timing diagrams to aid in the explanation of the invention.

At the start of trace damper diode 100 begins conduction to supply current to horizontal deflection winding 102. This current flow is illustrated in FIG. 4A by negative sawtooth waveform 142. When the electron beam scanning is approximately at the center of the screen of the cathode ray tube, transistor 90 conducts yoke current from winding 102 through diode 97 to provide positive sawtooth waveform 143. The positive pulse which causes transistor 90 to conduct for the necessary interval is illustrated by pulse 144.

During its conduction interval, transistor 90 conducts current from unregulated voltage supply 93 through primary winding 91 of transformer 92 to store energy in transformer 92. At the end of trace a pulse 145 is applied to transistor 90 to switch transistor 90 off. In the illustrated embodiment pulse 145 is obtained by differentiating the leading edge of the pulse at the collector of transistor 64 when transistor 64 is switched off. Thus, the time constant of capacitor 80 and resistor 83 determines the duration of pulse 145. The abrupt cut-off of current through horizontal deflection winding 102 causes winding 102 to oscillate with retrace capacitor 101 for one-half cycle to reverse the current through deflection winding 102. During this one-half cycle of oscillation, energy previously stored in transformer 92 is transferred from secondary winding 94 through diode 95 to retrace capacitor 101 to replace the energy lost in the previous cycle of operation. While a high-level injection system is illustrated and described, those skilled in the art will realize that low-level injection as described in the above-referenced article by M. J. Maytum can be used as well.

It should be noted that the above-described operation is generally similar to the operation of prior art horizontal deflection systems. In a self regulating horizontal deflection system, the above-described operation coincides generally with a high voltage condition of unregulated supply 93. Turn-on pulse 144 of FIG. 4A is basically the minimum duration necessary for proper and reliable operation of horizontal output transistor 90 for deflection purposes. Accordingly, the energy stored in transformer 92 and the amount of regulation provided should correspond to the highest unregulated voltage provided by supply 93.

A feedback means illustrated as including transformer 104 is connected to the horizontal output stage for providing a signal indicative of the magnitude of the unregulated voltage. In the specific arrangement illustrated secondary winding 110 provides flyback pulses which are indicative of the magnitude of unregulated voltage supply 93. These pulses are coupled via diode 112, potentiometer 113, Zener diode 115, and resistor 116 to the base of transistor 117. Potentiometer 113 adjusts the amplitude of the pulses which are clipped by Zener diode 115. Zener diode 127 provides a voltage reference across the resistance element of potentiometer 130. An adjustable fraction of this reference voltage is coupled to the base of transistor 123. The flyback pulses coupled to the base of transistor 117 cause transistor 117 to conduct a current dependent upon the magnitude of the pulses and the setting of variable resistor 121. Accordingly, the conduction of transistor 123 is varied depending upon the amplitude of the flyback pulses to provide an error signal across capacitor 133 which is coupled to modulator 62.

Figure 4B:
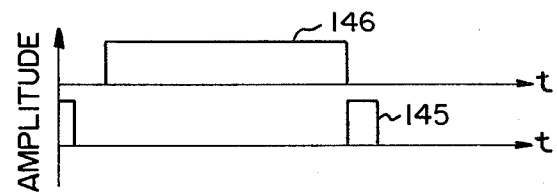

If the error signal indicates that unregulated source 93 is providing a low voltage, the width of the pulse provided by modulator 62 is increased to increase the conduction interval of transistor 64, and hence, the conduction interval of transistor 73. This increased conduction is illustrated by pulse 146 of FIG. 4B. Accordingly, transistor 90 conducts for a portion of the first half of the trace interval when trace diode 100 is also conducting deflection current. Diode 97 isolates the conduction of transistor 90 during the first half of trace from deflection winding 102.

Conduction of transistor 90 during the first half of trace increases the interval during which current flows through primary winding 91 of transformer 92 thereby storing more energy in transformer 92 to compensate for the low voltage provided by source 93. The voltage injection operation during retrace is the same as was previously described. Pulse 146 can be any duration up to a maximum of the entire trace interval, however, in practice a safety margin is provided to assure that transistor 90 does not turn on during retrace. As a practical matter, this safety factor will dictate the amount of modulation of the on time of transistor 90 that can be utilized in practice.

Accordingly, the system described provides a regulated voltage to the deflection circuitry from an unregulated supply 93. The voltage applied to primary winding 103 of transformer 104 is likewise regulated and the various regulated operating voltages can be derived from secondary windings in the manner illustrated. Alternatively, regulated voltages can be derived from secondary winding 94 of transformer 92 when used in a low voltage injection mode. As was described above, the voltage applied to the screen grids of the cathode ray tube can be derived from the collector of transistor 90 as is illustrated by load 141. Alternatively, the voltage for the screen grids can be derived from primary winding 103 of transformer 104 as well. These and numerous other modifications will be evident to those skilled in the art.

Figure 5:
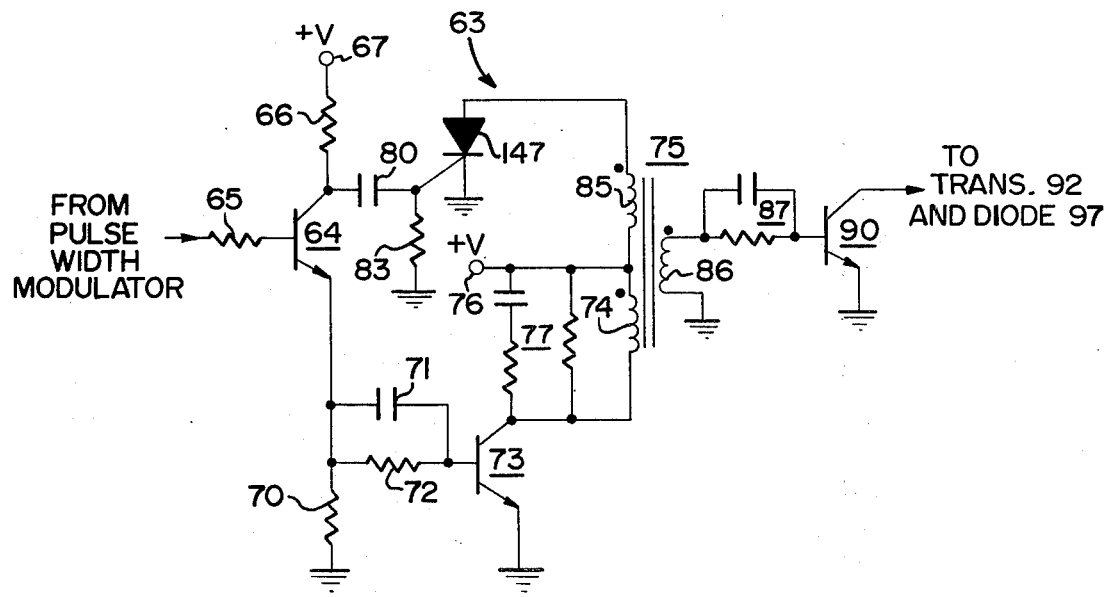
FIG. 5 is a schematic diagram of an alternate preferred embodiment of the invention.

FIG. 5 is a schematic illustration of a alternate embodiment of the invention wherein the semiconductor switch including transistor 82, diode 84, and resistor 81 are replaced by a controlled rectifier illustrated as an SCR 147 with a cathode connected to circuit ground, an anode connected to input winding 85 of transformer 75, and a gate connected to the junction of capacitor 80 and resistor 83. SCR 147 is turned on in the same manner as transistor 82. Current flow through primary winding 85 and SCR 147 provides pulse 145 to turn horizontal output transistor 90 off. When the reverse base current of transistor 90 decreases, the current through SCR 147 also decreases until it falls below the holding current of the SCR to turn SCR 147 off and terminate pulse 145.

Accordingly, a self-regulating horizontal deflection system has been shown and described. Driver circuit 63 including driver transistor 73, semiconductor switch 82 or 147, and transformer 75 possesses numerous advantages over the prior art. For examaple, known prior art transformer coupled drivers provide excess forward base drive to the horizontal output transistor. In a self-regulating horizontal deflection system of the type described the forward drive must be even greater to assure sufficient drive to the horizontal output transistor under the various conditions of operation. It is readily seen that the on time of transistor 90 varies greatly as is illustrated by pulses 144 and 146 of FIG. 4. The illustrated embodiment permits the forward and reverse drives to be optimized so that the forward drive need only be that necessary to saturate transistor 90 while the reverse drive is determined independently. Furthermore, the input and output winding inductances of transformer 75 can be designed separately to provide this optimum performance. Since the forward and reverse drive can be optimized, substantial excess power dissipation is avoided thereby conserving power as well as decreasing heat generation in the circuitry.

While there has been shown and described what is at present considered the preferred embodiments of the invention it will be obvious to those skilled in the art that various changes and modifications may be made therein without departing from the invention as defined by the appended claims.

What is claimed is:

1. In a television receiver having a signal receiver, a video channel connected thereto, and a cathode ray tube connected to said video channel, a self-regulating horizontal deflection system comprising:
    a horizontal deflection winding associated with said cathode ray tube for electron beam deflection therein;

a horizontal output stage connected to said deflection winding for providing a deflection signal thereto;

a source of unregulated voltage connected to said horizontal output stage;

feedback means connected to said horizontal output stage for providing a signal indicative of the magnitude of said unregulated voltage;

pulse width modulating means connected to said video channel and to said feedback means for providing a pulse signal synchronized with a composite video signal from said video channel and wherein the pulses are width modulated in accordance with the signal from said feedback means;

a transformer having an output winding connected to said horizontal output stage and first and second input windings;

a driver transistor connected to said pulse width modulating means and to said first input winding for applying the width modulated pulses to said first input winding with an amplitude and shape sufficient to drive said horizontal output stage to provide said deflection signal to said horizontal output winding, the width modulation of the pulses compensating for variations of said unregulated voltage; and a semiconductor switch connected to said pulse width modulating means and to said second input winding for initiating retrace of the electron beam deflection by switching said horizontal output stage.

2. A self-regulating horizontal deflection system as defined in claim 1 wherein said semiconductor switch is a transistor.

3. A self-regulating horizontal deflection system as defined in claim 1 wherein said semiconductor switch is a controlled rectifier.

4. A self-regulating horizontal deflection system as defined in claim 1 wherein said horizontal output stage includes a transistor having a base connected to said output winding and a collector connected to said horizontal deflection winding.

5. A self-regulating horizontal deflection system as defined in claim 4 wherein said feedback means includes a voltage comparator connected to said pulse width modulating means and a horizontal output transformer having a primary winding connected in parallel with said horizontal deflection winding and a secondary winding connected to said voltage comparator.

6. A self-regulating horizontal deflection system as defined in claim 5 wherein said horizontal output transformer includes at least one secondary winding connected to a voltage supply for supplying a regulated voltage.

7. A self-regulating horizontal deflection system for a television receiver including a signal receiver, a video channel connected thereto, and a cathode ray tube connected to said video channel, said horizontal deflection system including a horizontal deflection winding associated with said cathode ray tube, a horizontal output stage connected to a source of unregulated voltage for providing a deflection signal to said horizontal deflection winding, feedback means connected in circuit with said horizontal output stage for providing a feedback signal indicative of the magnitude of said unregulated voltage, pulse width modulating means connected to said video channel and to said feedback means for providing a pulse signal synchronized with a composite video signal from said video channel and modulated in accordance with the signal from said feedback means, and driver means connected to said pulse width modulating means and to said horizontal output stage comprising:

a transformer having an output winding connected to said horizontal output stage and first and second input windings;

a driver transistor connected to said pulse width modulating means and to said first input winding for applying the pulses therefrom to said first input winding with an amplitude and shape sufficient to drive said horizontal output stage to provide said deflection signal to said horizontal output winding, the width modulation of the pulses compensating for variations of said unregulated voltage; and a semiconductor switch connected to said pulse width modulating means and to said second input winding for initiating retrace of the electron beam deflection in said cathode ray tube by switching said horizontal output stage.

8. A self-regulating horizontal deflection system as defined in claim 7 wherein said semiconductor switch is a transistor.

9. A self-regulating horizontal deflection system as defined in claim 7 wherein said semiconductor switch is a controlled rectifier.

10. A self-regulating horizontal deflection system as defined in claim 7 wherein said horizontal output stage includes a transistor having a base connected to said output winding and a collector connected to said horizontal deflection winding, said feedback means includes a voltage comparator connected to said pulse width modulating means and a horizontal output transformer having a primary winding connected in parallel with said horizontal deflection winding and a secondary winding connected to said voltage comparator, and said horizontal output transformer includes at least one secondary winding connected to a voltage supply for supplying a regulated voltage.

* * * * *